(12) United States Patent
Kim et al.

(10) Patent No.: US 6,498,047 B2
(45) Date of Patent: Dec. 24, 2002

(54) APPARATUS AND METHOD FOR MEASURING WAFER CLAMPING TENSION

(75) Inventors: Dong-Sik Kim, Suwon (KR); Cheol-Su Park, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 28 days.

(21) Appl. No.: 09/851,086

(22) Filed: May 9, 2001

(65) Prior Publication Data

US 2002/0037597 A1 Mar. 28, 2002

(30) Foreign Application Priority Data

Sep. 22, 2000 (KR) .......................................... 2000-55649

(51) Int. Cl.[7] .............................. H01L 21/66; G01B 5/30
(52) U.S. Cl. ............................................ 438/14; 73/760
(58) Field of Search ....................... 438/14, 15; 73/760, 73/788, 818, 849, 856, 857, 858, 859, 860; 29/25.01

(56) References Cited

U.S. PATENT DOCUMENTS 5,350,427 A * 9/1994 Freytsis et al. ............. 118/503

FOREIGN PATENT DOCUMENTS

EP 0 607 043 A1 * 7/1994 ........... H01L/21/00

* cited by examiner

Primary Examiner—Michael Sherry
Assistant Examiner—Evan Pert
(74) Attorney, Agent, or Firm—Volentine Francos, PLLC

(57) ABSTRACT

A wafer clamping tension measuring apparatus includes a base plate having a guide groove formed in an upper surface and a moving plate having a guide rail protruding from a lower surface and reciprocating with the guide groove. A tension gauge is fixed to an upper surface of the moving plate for measuring the tension of a wafer clamping elastic member confronting the tension gauge. A displacement restricting block is attached at one end of the base plate nearest to the wafer clamping elastic member to restrict the movement of the moving plate relative to the base plate when the moving plate is displaced towards the displacement restricting block.

8 Claims, 7 Drawing Sheets

APPARATUS AND METHOD FOR MEASURING WAFER CLAMPING TENSION

BACKGROUND OF THE INVENTION

1. Field of the Invention

The present invention relates to an apparatus for measuring wafer clamping tension, and more particularly, to an apparatus that can accurately measure and adjust the tension of an elastic member used in clamping the wafers, thereby preventing the clamped wafers from moving or dropping during a manufacturing process.

2. Description of the Related Art

In order to produce a highly-integrated, highly-functional semiconductor product, a variety of stringent operating conditions must be met during the intricate manufacturing process. Because of the minute dimensions and very small tolerances inherent in semiconductor manufacturing, one important requirement is the ability to firmly and accurately fix a plurality of wafers at predetermined positions while performing various semiconductor fabrication processes.

One conventional method of fixing wafers with an elastic member at a predetermined position is described in U.S. Pat. No. 5,350,427 (the '427 patent), entitled "Wafer Retaining Platen Having Peripheral Clamp and Wafer Lifting Means." The '427 patent describes a protruding fence at one end of a platen at which wafers are to be fixed, a finger assembly formed at the opposing end of the platen for applying pressure with an elastic member to push the edge of the wafer toward the fence, and an operational unit installed at a lower portion of the finger assembly for selectively operating the finger assembly to load/unload the wafers, so that the finger assembly and fence can prevent the wafers from moving or dropping during processing.

However, in semiconductor manufacturing facilities where wafers are clamped by employing such an elastic member, repeated use of the elastic member can change the tensioning characteristics thereof, which in turn can cause the elastic members to fail to apply the requisite pressure to push the wafer toward the fence. As a result, the wafers may drop or move from the predetermined position to thereby cause a problem in the manufacturing process.

In an effort to solve this problem, present methods use a common commercial tension gauge in an effort to estimate and measure the elastic force used for clamping wafers. However, a problem exists in that such methods do not produce consistent results because the workers that use the tension gauge may measure the tension at different positions and apply different pressures during the readings.

SUMMARY OF THE INVENTION

Accordingly, it is an object of the present invention to provide an apparatus for measuring wafer clamping tension that provides consistent and accurate results for elastic member tension, regardless of which worker initiates the measurement.

To achieve this and other objects, the present invention provides a wafer clamping tension measuring apparatus, including a base plate having a guide groove formed in an upper surface and a moving plate having a guide rail protruding from a lower surface and reciprocating with the guide groove. A tension gauge is fixed to an upper surface of the moving plate for measuring the tension of a wafer clamping elastic member confronting the tension gauge. A displacement restricting block is attached at one end of the base plate to restrict the movement of the moving plate relative to the base plate when the moving plate is displaced towards the displacement restricting block.

Preferably, the base plate includes protrusions extending from a lower surface. The protrusions may be oriented so as to be aligned with holes on a wafer pedestal pad on which the base plate is placed.

The tension gauge includes a tension rod extending from the tension gauge, and a tension measuring block fixed to the other end of the tension gauge, such that the tension measuring block contacts the wafer clamping elastic member. The height of the tension measuring block from the surface can be adjusted.

In another embodiment, the present invention provides a method for measuring a wafer clamping tension, wherein the base plate of the wafer clamping tension measuring apparatus is fixed relative to the wafer clamping elastic member, and then a moving plate that reciprocates relative to the base plate is pushed towards the wafer clamping elastic member. A tension gauge attached to the moving member measures and displays the tension value. Displacement of the moving plate is accurately determined and standardized through repeated procedures by a displacement restricting block attached to one end of the base plate.

BRIEF DESCRIPTION OF THE DRAWINGS

The above objects and advantages of the present invention will become more readily apparent from the detailed description of the preferred embodiments, with reference to the accompanying drawings, in which.

DETAILED DESCRIPTION OF THE PREFERRED EMBODIMENTS

Figure 1:
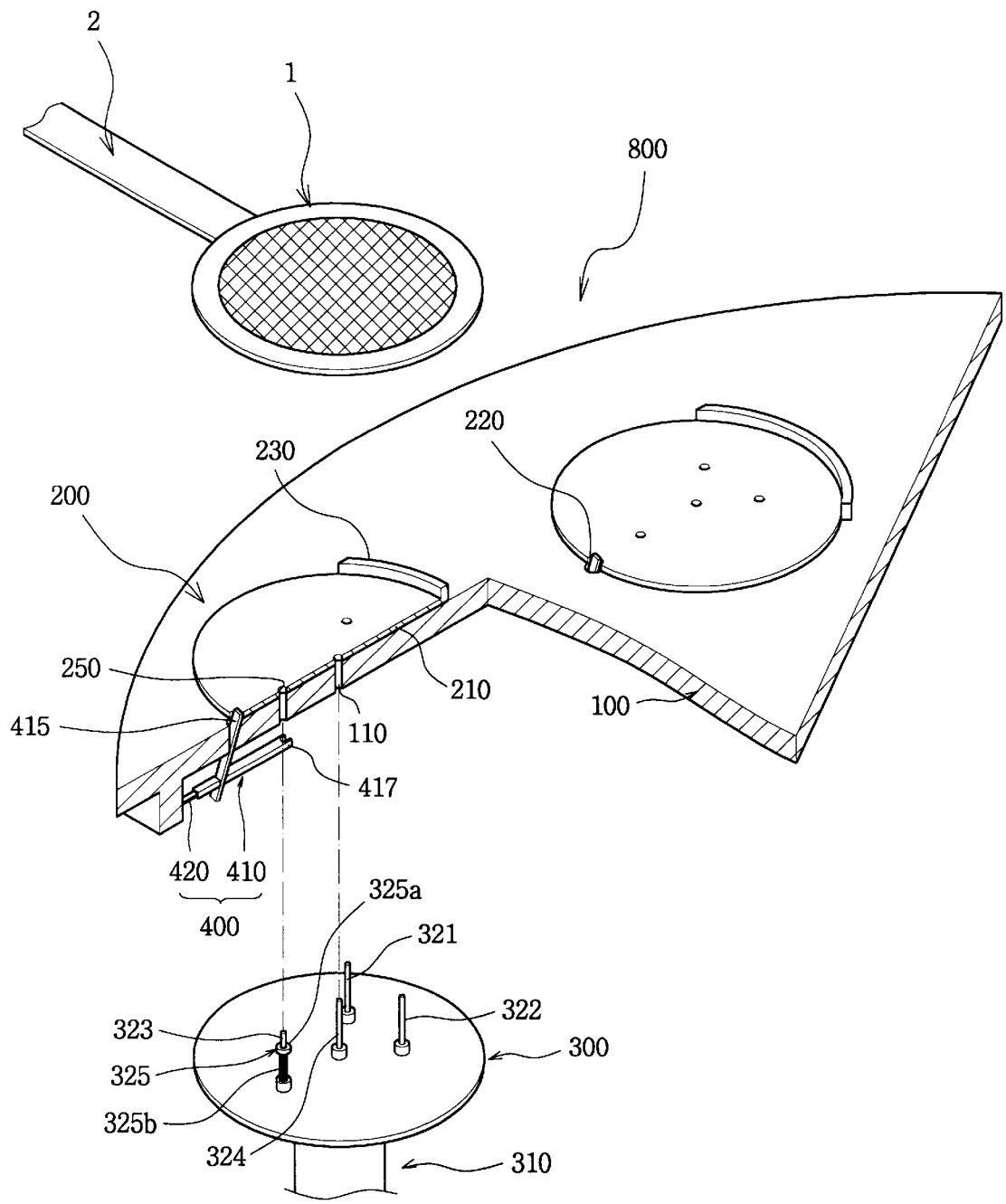
FIG. 1 is a partially cut-away, perspective view illustrating a spinning disc of an ion implantation unit equipped with a wafer clamping tension measuring apparatus in accordance with the present invention.

FIG. 1 is a partially cut-away, perspective view illustrating a spinning disc of an ion implantation unit equipped with a wafer clamping tension measuring apparatus in accordance with the present invention. In this embodiment, the spinning disc assembly 800 supports wafers 1 during an ion implantation process. In addition to supporting and precisely positioning the wafers during the ion implantation process, the spinning disc assembly rotates the wafers at a predetermined speed to achieve uniformity of ion implantation. Note that while the present embodiment is described with reference to an ion implantation unit, the principles of the present invention are not limited thereto, and may be applied to any wafer manufacturing process.

The spinning disc assembly 800 includes spinning disc 100, wafer pedestal 200, wafer loading/unloading unit 300, wafer clamping finger unit 400, spinning disc turning unit (not shown) and spinning disc rotating unit (not shown).

The spinning disc 100 is shaped like a large circular plate and includes a turning unit or shaft connected to a rotating unit (not shown) installed at the center of the rotation of the spinning disc 100 for turning the spinning disc 100 during the ion implanting process, for example, at the speed of about 1000 RPM or more.

At least one or more wafer pedestals 200 are circularly arranged at positions that are equidistant from the center of the spinning disc 100 and are firmly fixed to the upper surface of the spinning disk 100. The wafer pedestals 200 are formed in the shape of a circular plate and directly contact the lower surface of the wafers 1. The wafer pedestals 200 include an accommodating pad 210 and finger groove 220. The wafer accommodating pad 210 is formed in the shape of a circular plate with is its lower surface being firmly fixed to the upper surface of the disc 100 and its top surface being rubber coated.

An upwardly protruding, arcuate shaped fence 230 is installed along part of the circumferential edge of the wafer accommodating pad 210, and the finger groove 220 is formed across from the fence 230. When a finger 410 of a wafer clamping finger unit 400 (described further below) is inserted into the finger groove 220, the wafer 1 is pressed against the fence 230.

As shown in FIG. 1, when the wafer 1 is to be loaded or unloaded by a partially shown wafer transfer unit 2, it is difficult for the wafer transfer unit 2 to directly load the wafer onto the wafer pedestals 200. Therefore, a wafer loading/unloading unit 300 is positioned below the lower surface of the spinning disc 100.

The wafer loading/unloading unit 300 includes: a loading/unloading elevator 310 that moves vertically; wafer loading/unloading pins 321, 322, 323 projecting from the loading/unloading elevator 310; wafer detection sensor 324 for sensing wafers 1; and a finger operating unit 325. The three wafer loading/unloading pins 321, 322, 323 are oriented in a triangular configuration, and the wafer detection sensor 324 is positioned at the center of the wafer loading/unloading elevator 310. The wafer loading/unloading pin 323 formed closest to the aforementioned finger groove 220 includes a finger operating unit 325 for operating the finger 410 of the wafer clamping finger unit 400 which will be described below in detail. The finger operating unit 325 further includes a spring 325b inserted into the wafer loading/unloading pin 323, and a ring-shaped hitching plate 325a formed at the top of the spring 325b.

In order to get the wafer loading/unloading unit 300 to load or unload the wafers 1 to or from the wafer pedestals 200, through-holes 250, 110 are formed in the spinning disc 160 and the wafer pedestals 200 at locations corresponding to the wafer loading/unloading pins 321, 322, 323 (through holes 250) and the wafer detection sensor 324 (through holes 110).

Figure 2:
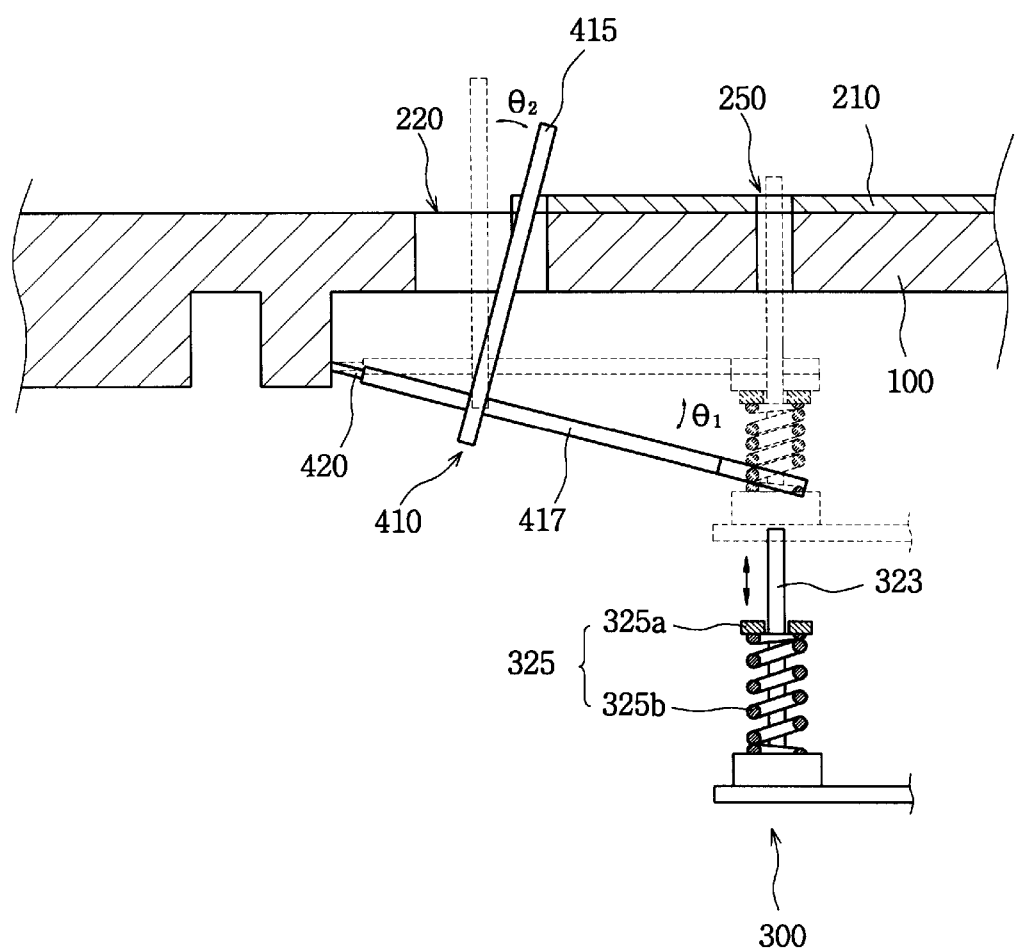
FIG. 2 is a cross-sectional view illustrating a relationship among a spinning disc, a wafer loading/unloading unit, and a wafer clamping finger unit.

Now the wafer clamping finger unit 400, and its interaction with the wafer loading/unloading unit 300, will be described with reference to FIG. 2. The wafer clamping finger unit 400 comprises an L-shaped finger 410 and is connected to the spinning disc 100 via a plate spring 420. The finger 410 includes a finger tip 415 that projects through the spinning disc 100 through the finger groove 220, and a finger operating part 417 positioned below the spinning disc 100.

The finger operating part 417 of the finger 410 also includes a concave groove or through-hole at its distal end (shown more clearly in FIG. 1), which is where the wafer loading/unloading pin 323 of the wafer loading/unloading unit 300 interacts with the finger operating unit 325 to lift the finger operating part 417 up by an angle of $\theta_1$, and in turn tilts the finger tip 415 by an angle of $\theta_2$.

As a result, when the wafers are loaded onto the pedestals 200, the finger tip 415 moves to an area where it does not disturb the loading of the wafers by moving the wafer loading/unloading unit 300 upwards. After the wafer is loaded on the wafer pedestal 200, the wafer loading/unloading unit 300 moves downward so that the finger tip 415 is pressed against the circumference of the wafers toward the fence 230 to fix the wafers 1 at the predetermined positions.

Figure 3:
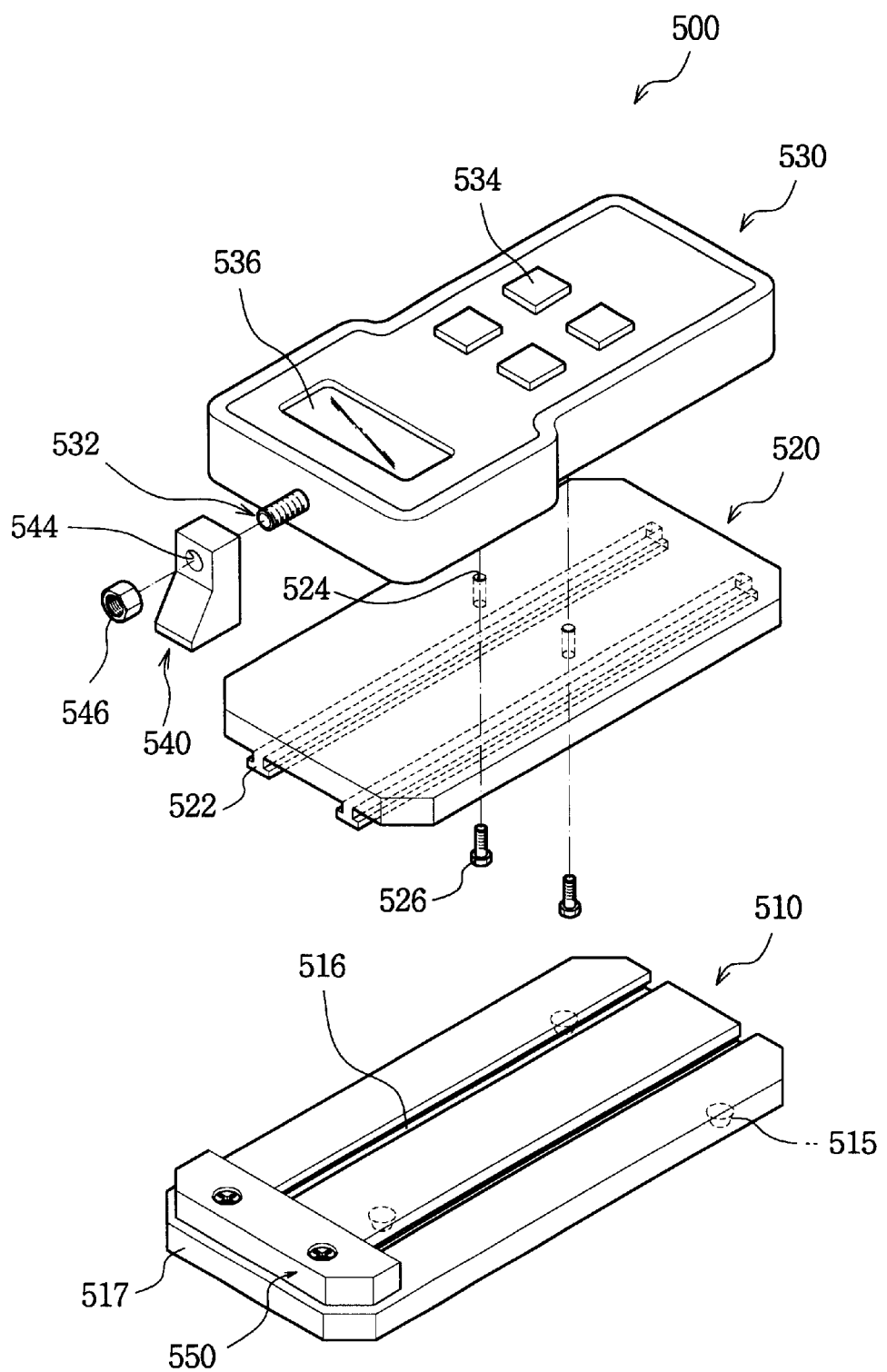
FIG. 3 is an exploded perspective view illustrating an apparatus for measuring the tension of a wafer clamping finger unit of the spinning disc shown in FIGS. 1 and 2.

FIG. 3 is an exploded perspective view illustrating a tension measuring apparatus 500 for measuring the tension of the wafer clamping finger unit 400 described above. The measuring apparatus 500 includes a standard base plate 510, moving plate 520, tension gauge 530, measuring tip 540, and displacement restricting block 550.

Figure 4:
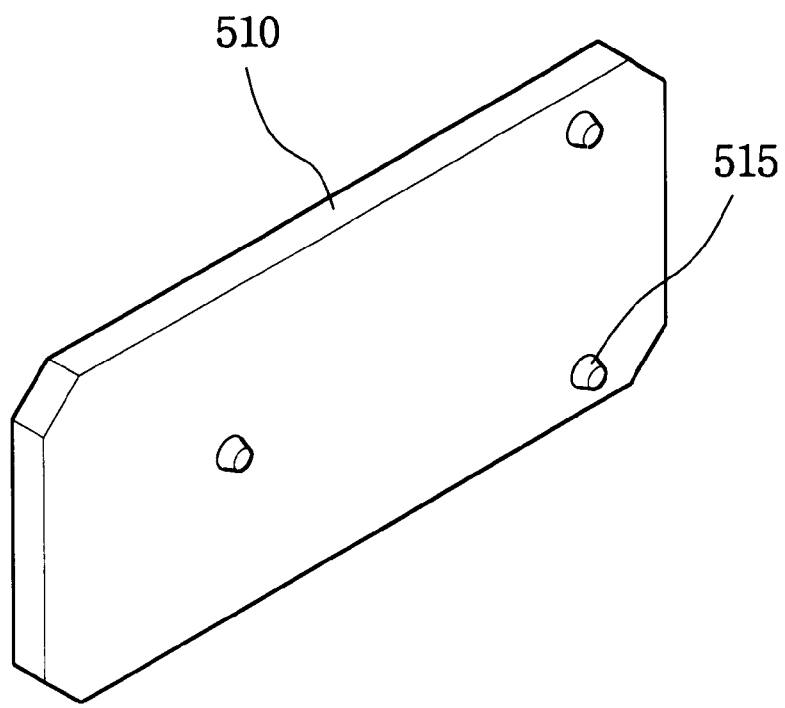
FIG. 4 is a perspective view illustrating the back side of the moving plate shown in FIG. 3.
Figure 5:
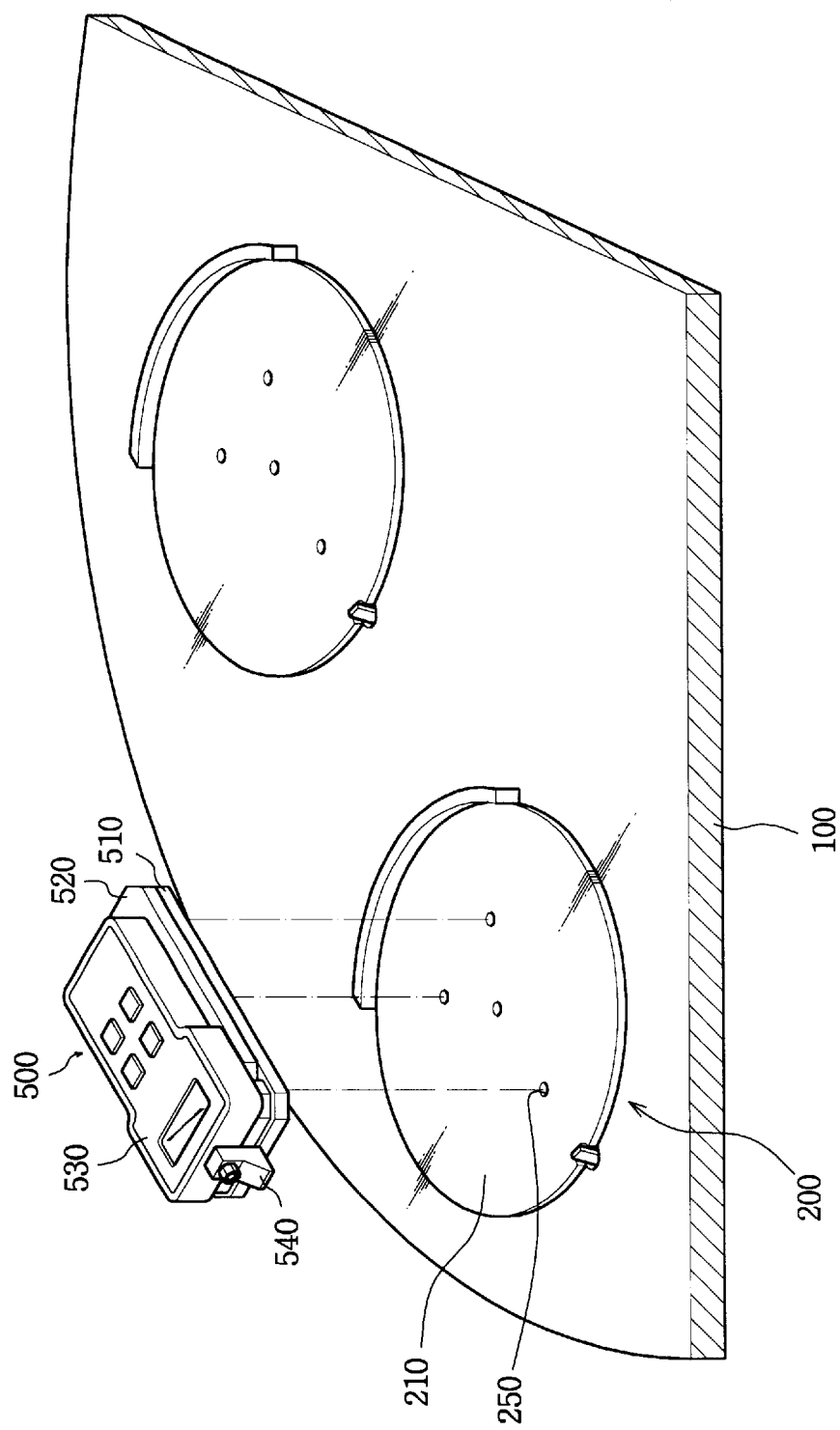
FIG. 5 is an partial exploded perspective view illustrating the structure of a tension measuring apparatus and a spinning disc in accordance with the present invention.

More specifically, the standard base plate 510 is a flat, rectangular shaped plate with beveled corners (that is, a hexahedral shape). Fixing protruders 515 are formed at the lower surface of the standard base plate 510 (see also FIG. 4) to stabilize and fix the standard base plate 510. The fixing protruders 515 are oriented so that they are aligned with, and can be inserted, into through-holes 250 of the spinning disc 100 and wafer pedestals 200 as shown in FIG. 5. The fixing protruders 515 ensure the standard base plate 510 is placed in the same standard measuring position at all times.

Referring back to FIG. 3, one pair of guide rail grooves 516 are formed at the opposite side of the fixing protruder 515 of the standard base plate 510 with a predetermined distance therebetween, with the guide rails 516 extending from one edge of the standard base plate 510 to the other in a longitudinal direction. Note that the guide rails 516 extend in the same direction as the movement of the finger tip 415 described above. Preferably, the cross-section of the guide rail groove 516 has a dovetail shape, similar to an I-beam configuration, to correspond to a similar shaped guide rail 522 of the moving plate 520, which when coupled with the rail groove 516, can reciprocate linearly without vertical separation.

The moving plate 520 has the same hexahedral shape as the standard base plate 510. The guide rails 522 formed at the lower surface of the moving plate 520 are inserted to the guide rail grooves 516 of the standard base plate 510. At least one or more screw holes 524 are formed in the moving plate 520.

A tension gauge 530 is installed on the moving plate 520 for measuring the tension of the wafer clamping finger unit 400. The tension gauge 530 is firmly fastened to the moving plate 520 by means of a screw 526 inserted into the fastening hole 524. The tension gauge 530 includes a tension rod 532 to actually measure the tension. Preferably, the tension gauge 530 includes functional buttons 534 (e.g., a reset or initialization button, maximum value button, etc.) and a display window 536 to display the tension value. The tension rod 532 has a male screw portion at one end, and is inserted though a longitudinal hole 544 in the tension measuring block 540 for coupling using nut 546. The tension measuring block 540 confronts the finger tip 415 in order to measure the tension as determined by the displacement of the tension measuring block 540. The longitudinal hole 544 is formed such that there can be some vertical movement of the tension rod 532 inside is the hole 544. In other words, the circumference of the longitudinal hole 544 is greater than the circumference of the tension rod 532. This enables the tension measuring block 540 to be positioned at a designated height such that the bottom surface of the tension measuring block 540 does not contact the upper rubber surface of the wafer pedestals 200, after which the nut 546 is tightened. This prevents damage to the wafer pedestals 200, and provides an accurate measurement since the tension measuring block 540 can move freely.

Note that a 0.1 mm change in displacement (e.g., 5 mm to 5.1 mm) of the tension measuring block 540 pushing on the finger tip 415 may actually be a rather large change in tension value. However, it is impossible for a worker to confirm visually or through experience that the tension measuring block 540 is pushed by a predetermined length of displacement, for instance, 4.9 mm, 5 mm or 5.1 mm. Therefore, a displacement restricting block 550 is additionally installed at the end 517 of the standard plate 510 for restricting the movement of the moving plate 520. The displacement restricting block 550 makes it possible for any worker to press the finger tip 415 with the tension measuring apparatus 500 by a predetermined length of displacement, so that the worker can accurately measure the tension of the wafer clamping finger unit 400. Even if the diameter of the wafers 1 is changed, the displacement restricting block 550 can be replaced with another one having a different diameter to fit the wafer accommodating pad 210. This would not change the positions of the wafer loading/unloading pins.

Figure 6:
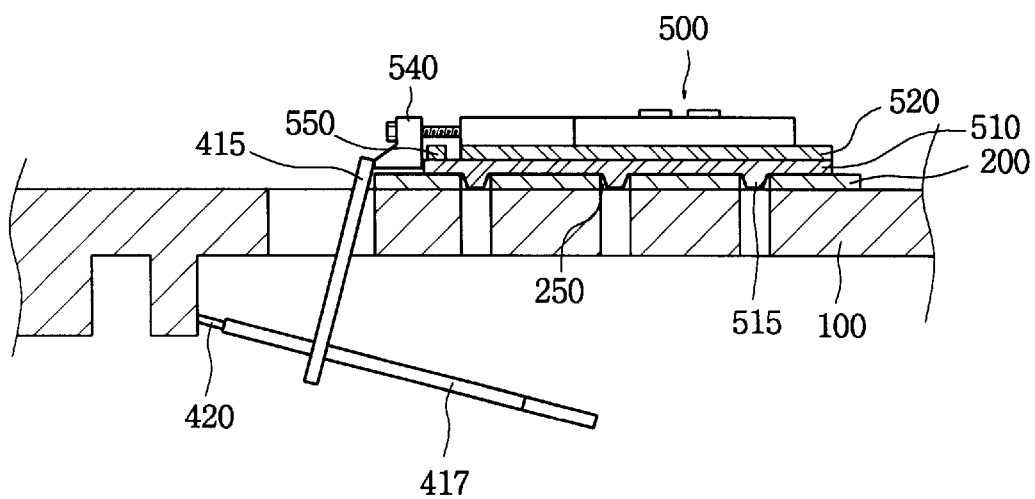
FIG. 6 is a cross-sectional view illustrating a state of a tension measuring apparatus just before measuring the tension of a finger of a wafer clamping finger unit in accordance with the present invention.
Figure 7:
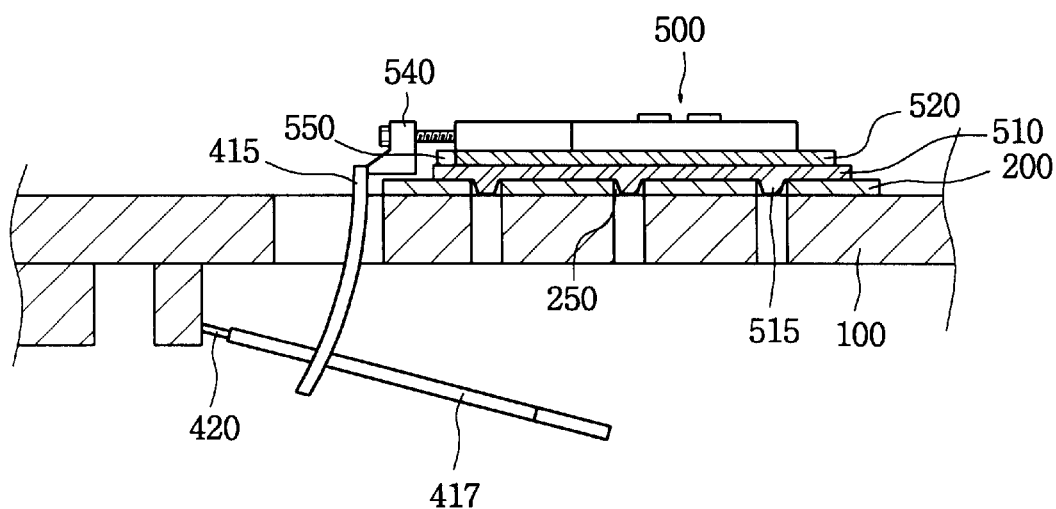
FIG. 7 is a cross-sectional view illustrating a state of a tension measuring apparatus just after measuring the tension of a finger of a wafer clamping finger unit in accordance with the present invention.

FIGS. 5 through 7 illustrate a method for measuring the tension of the wafer clamping finger unit 400 with the tension measuring apparatus 500 of the present invention. First, fixing protruders 515 formed at the bottom surface of the standard base plate 510 of the tension measuring apparatus 500 are aligned and inserted into the through-holes 250 formed at the upper surface of the wafer accommodating pad 210 of the wafer pedestals 200, so that the tension measuring apparatus 500 is fixed in a standard position for measurement.

Then, the nut 546 fixing the tension measuring block 540 of the tension measuring apparatus 500 is released to enable a gap gauge of approximately 0.3 mm in thickness between the top surface of the wafer accommodating pad 210 and the bottom surface of the tension measuring block 540 while the tension measuring block 540 is left movable. Then, the nut 546 is tightened to fix the tension measuring block 540. Accordingly, a predetermined gap is formed between the wafer accommodating pad 210 and the tension-measuring block 540 to ensure accurate measurement and prevent the tension measuring block 540 from scratching the upper surface of the wafer accommodating pad 210.

A worker then initializes the measuring process such that the tension gauge 530 is set to zero, and the moving plate 520 is moved toward the finger tip 415 until the moving plate contacts the displacement restricting block 550 as shown in FIG. 6 and FIG. 7. Accordingly, the tension of the wafer clamping finger unit 400 can be accurately measured by the tension gauge 530. Tension readings outside the limits will enable the workers to readjust and set the proper limits before the wafer manufacturing process continues.

As described above, one advantage of the tension measuring apparatus of the present invention is that the finger pressing force needed for clamping wafers can always be measured accurately with only a simple manipulation, regardless of the worker carrying out the measurement procedure.

While the present invention was described in detail referring to the attached embodiments, various modifications, alternate constructions and equivalents may be employed without departing from the true spirit and scope of the present invention as set forth in the appended claims.

What is claimed is:

1. A wafer clamping tension measuring apparatus, comprising:
    a base plate having a guide groove formed in an upper surface;
    a moving plate having a guide rail protruding from a lower surface, the guide rail communicating with the guide groove of the base plate such that the moving plate reciprocates relative to the base plate;
    a tension gauge fixed to an upper surface of the moving plate for measuring the tension of a wafer clamping elastic member confronting the tension gauge; and
    a displacement restricting block attached at one end of the base plate nearest the wafer clamping elastic member to restrict a movement of the moving plate relative to the base plate when the moving plate is displaced towards the displacement restricting block.

2. The apparatus of claim 1, wherein the base plate further comprises protrusions extending from a lower surface, said protrusions oriented so as to be aligned with holes on a wafer pedestal pad on which the base plate is placed.

3. The apparatus of claim 2, wherein the guide groove of the base plate has a dovetailed shape and the guide rail of the moving plate has a corresponding dovetail shape, such that the reciprocating movement is interlocked so as to allow horizontal movement while restricting vertical movement of the moving plate relative to the base plate.

4. The apparatus of claim 2, the tension gauge further comprising:
    a tension rod extending at one end from a housing of the tension gauge, and a tension measuring block fixed to another end of the tension rod external the housing of the tension gauge, the tension measuring block contacting the wafer clamping elastic member.

5. The apparatus of claim 4, wherein an other end of the tension rod extends through a through hole in the tension measuring block, and wherein a circumference of the through hole is larger than a circumference of the tension rod, such that a height of the tension measuring block from a surface can be adjusted.

6. A method of measuring wafer clamping tension, comprising:
    providing a wafer clamping tension measuring apparatus confronting a wafer clamping elastic member, wherein the wafer clamping tension measuring apparatus is provided so as to include
    a base plate having a guide groove formed in an upper surface,
    a moving plate having a guide rail protruding from a lower surface, the guide rail communicating with the guide groove of the base plate such that the moving plate reciprocates relative to the base plate,
    a tension gauge fixed to an upper surface of the moving plate for measuring the tension of the wafer clamping elastic member confronting the tension gauge, and
    a displacement restricting block attached at one end of the base plate to restrict a movement of the moving plate relative to the base plate when the moving plate is displaced towards the displacement restricting block;

moving the tension gauge in the direction of the wafer clamping elastic member until the moving plate contacts the displacement restricting block; and reading a tension value displayed on the tension gauge as the tension gauge contacts and displaces the wafer clamping elastic member.

7. The method of claim 6, wherein prior to the moving step, further comprising fixing the wafer clamping tension measuring apparatus relative to the wafer clamping elastic member.

8. The method of claim 7, wherein prior to the fixing step, further comprising adjusting a height above a surface of a tension measuring block extending from the tension gauge.

* * * * *